United States Patent [19]

Takahashi

[11] 4,029,906

[45] June 14, 1977

[54] AUTOMATIC NOISE REDUCTION SYSTEM OF FM STEREO RECEIVER

[75] Inventor: Shinobu Takahashi, Mitaka, Japan

[73] Assignee: Sansui Electric Co., Ltd., Tokyo, Japan

[22] Filed: Apr. 14, 1976

[21] Appl. No.: 676,860

[30] Foreign Application Priority Data

Apr. 18, 1975   Japan .................. 50-51984[U]

[52] U.S. Cl. ......................................... 179/15 BT
[51] Int. Cl.² ........................................ H04H 5/00
[58] Field of Search ............ 179/15 BT, 1 G, 1 GQ, 179/100.1 TD, 100.4 ST; 325/36

[56] References Cited

UNITED STATES PATENTS

| | | | |
|---|---|---|---|
| 3,673,342 | 6/1972 | Muller | 179/15 BT |
| 3,823,268 | 7/1974 | Modafferi | 179/15 BT |
| 3,825,697 | 7/1974 | Cornell et al. | 179/15 BT |
| 3,919,482 | 11/1975 | Hamada | 179/15 BT |
| 3,943,293 | 3/1976 | Bailey | 179/15 BT |

*Primary Examiner*—Douglas W. Olms
*Attorney, Agent, or Firm*—Harris, Kern, Wallen & Tinsley

[57] ABSTRACT

Disclosed is an automatic noise reduction system of FM stereo receiver wherein the input level and carrier frequency deviation of an FM stereo transmission signal received by an antenna are detected and, when at least either one of the input level and carrier frequency deviation decreases, the separation between first and second audio outputs of a stereo demodulator for demodulating the FM stereo transmission signal is decreased and simultaneously high frequency components on the first and second audio outputs are attenuated.

10 Claims, 7 Drawing Figures

AUTOMATIC NOISE REDUCTION SYSTEM OF FM STEREO RECEIVER

BACKGROUND OF THE INVENTION

This invention relates to an FM stereo receiver, and more particularly to an automatic noise reduction system of the FM stereo receiver.

In an FM stereo receiver, upon decrease in the antenna input level and carrier frequency deviation of an FM stereo transmission signal, the signal-to-noise ratio of reproduced stereo signals is sometimes decreased to interrupt high quality reproduction of stereo signals. Most of the noise components generated upon reception and demodulation of the FM stereo transmission signal are triangular noises contained in opposite phase relationship, in the right and left audio outputs of a stereo demodulator. Further, human's ears are more sensitive to high frequency noise components than low frequency noise components.

For the above-mentioned reasons, a conventional FM stereo receiver is provided with means called a multiplex noise filter or high blend circuit and designed to operate mostly by a manual switch to blend with each other high frequency components of the signals appearing on the right and left output channels, thereby to cancel high frequency components of the triangular noises upon decrease in the SN ratio. However, such high blend circuit included in a conventional receiver is impotent over the mutually opposite phase components of intermediate and lower frequency ranges, the noise components contained in the same phase relationship in both output channels, and the high frequency noise components contained in only either one of the output channels.

When, in the case of using the above-mentioned manually operable high blend circuit, it is erroneously placed in an operative condition with the SN ratio kept to be good, the channel separation is unnecessarily decreased. Further, if, in the case of manual operation, the SN ratio is once decreased during the recording of stereo signals, extreme inconveniences will result.

The antenna input level is not always kept constant but fluctuates from time to time owing to weather, etc. and besides the frequency deviation of carrier signal also fluctuates from instant to instant during the period of the same program, for which reason there is a possibility of the SN ratio being often varied.

SUMMARY OF THE INVENTION

Accordingly, it is the object of the invention to provide an automatic noise reduction system of FM stereo receiver which, when the SN ratio is decreased in accordance with the variation in the antenna input level and carrier frequency deviation, can effectively reduce not only the mutually opposite phase high frequency noise components but also the mutually opposite phase low and intermediate frequency noise components in both output channels, and the high frequency noise components contained in only either one of the output channels.

The automatic noise reduction system of FM stereo receiver according to the invention comprises a first detection circuit for detecting the antenna input level of an FM stereo transmission signal received by an antenna, a second detection circuit for detecting the frequency deviation of carrier of the FM stereo transmission signal, and a control circuit coupled to first and second audio outputs of a stereo audio detector or demodulator such a synchronous detector for demodulating the FM stereo transmission signal to produce stereo related audio signals at the first and second audio outputs, respectively, and operative, when at least either one of the antenna input level and carrier frequency deviation of the FM stereo transmission signal decreases, in response to the outputs from the first and second detection circuits, to reduce the separation between the first and second audio outputs and simultaneously attenuate high frequency components of each audio output.

The antenna input level may be detected by the amplitude level of an intermediate frequency FM signal after frequency conversion. The carrier frequency deviation may be detected by the amplitude level of a main signal which is a sum of the stereo related left and right audio signals contained in the output of a frequency discriminator such as a ratio detector.

According to an embodiment of the invention, the control circuit comprises a circuit for producing first, second and third control signals each of which has a magnitude which is a function of the antenna input level and the carrier frequency deviation and is generated when at least one of the antenna input level and the carrier frequency deviation decreases from a predetermined level, a first blend circuit or high blend circuit for controlling, in response to the first control signal, to such an extent as to correspond to the magnitude thereof, the separation between the first and second outputs of the stereo audio detector with respect to high frequency range, a second blend circuit or full range blend circuit for controlling, in response to the second control signal, to such an extent as to correspond to the magnitude thereof, the separation between the first and second outputs of the stereo audio detector with respect to low, intermediate and high frequency ranges, and an attenuating circuit for attenuating, in response to the third control signal, to such an extent as to correspond to the magnitude thereof, the high frequency components of each audio output of the stereo audio detector.

The first blend circuit serves to cancel the mutually opposite phase high frequency noise components contained in the first and second audio outputs of the stereo audio detector. The second blend circuit serves to cancel especially the mutually opposite phase intermediate or lower frequency noise components. And the attenuating circuit serves to reduce the high frequency noise components contained in only either one of the first and second audio outputs, or substantially the same phase high frequency noise components contained in both outputs.

DETAILED DESCRIPTION OF THE PREFERRED EMBODIMENTS

Figure 1:
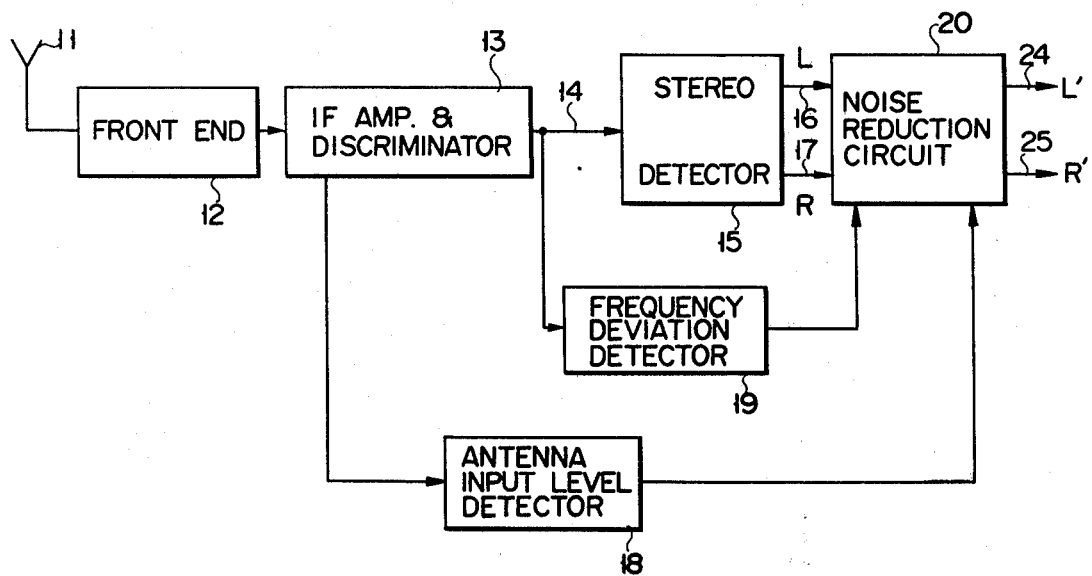
FIG. 1 is a schematic block diagram of an automatic noise reduction system according to an embodiment of the invention.

In FIG. 1, a reference numeral 11 denotes an antenna for receiving an FM stereo transmission signal in which a carrier in the VHF band is frequency-modulated by a main channel signal (L+R) having an audio frequency spectrum of 50 Hz to 15 kHz, a suppressed-carrier amplitude-modulated subchannel signal (L−R) having a frequency spectrum of 23 kHz to 53 kHz around the subcarrier frequency of 38 kHz and a pilot signal having a frequency of 19 kHz which is a subharmonic of 38 kHz. The SCA component usually contained in an FM stereo transmission signal is omitted from the matter of the invention. In the same manner as in a known receiver, the FM stereo transmission signal received by the antenna 11 is subject to RF amplification and frequency conversion by a front end section 12 to provide an intermediate frequency FM signal having a central frequency of 10.7 MHz. In the same manner as in a known receiver, the intermediate frequency FM signal is supplied to an IF amplifier & frequency discriminator 13 to provide the main channel signal (L+R), the suppressed-carrier amplitude-modulated subchannel signal (L−R) and the 19 kHz pilot signal on an output 14 thereof. The output signals from the discriminator 13 are supplied to a known stereo detector system 15 to provide stereo related signals L, R on audio output channels 16, 17 respectively.

Figure 2:
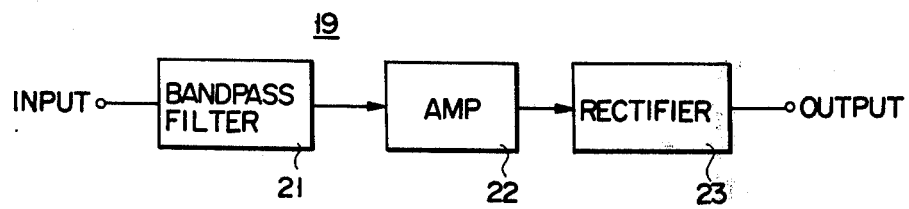
FIG. 2 is a schematic block diagram of the carrier frequency deviation detector of FIG. 1.

According to the invention, a detector 18 is provided for detecting the antenna input level of the FM stereo transmission signal in accordance with the output level of the IF amplifier. The detector 18 may include a rectifier and a time constant circuit, and is so designed as to detect the antenna input level of the FM stereo transmission signal in accordance with the amplitude level of the intermediate frequency FM signal, thereby to provide a DC output voltage proportionate to the antenna input level. Further, due to the fact that when the carrier of the FM stereo transmission signal is subject to a large frequency deviation, the output level of the descriminator 13 is large, whereas when that carrier is subject to a small frequency deviation, that output level is small, a carrier frequency deviation detector 19 is provided at the output 14 of the discriminator 13, thereby to provide a DC output voltage proportionate to the carrier frequency deviation. The carrier frequency deviation detector 19, as shown in, for example, FIG. 2, may be comprised of a bandpass filter 21 having a pass band characteristic of for example, 100 Hz to 8 kHz, an amplifier 22, and a rectifier 23 including a time constant circuit, and is so designed as to detect the frequency deviation of carrier in accordance with the amplitude level of the main channel signal (L+R). Further, to output channels 16, 17 of the stereo detector 15 is coupled a noise reduction circuit 20 for, when at least one of the antenna input level and the carrier frequency deviation becomes lower than specified, decreasing the separation between the left and right audio outputs 16, 17 of the stereo detector 15 and simultaneously varying the frequency response of each audio output, that is, decreasing especially the high frequency response thereof, thereby to effect noise reduction. This noise reduction circuit 20 has output channels 24, 25 and, when at least one of the antenna input level and the carrier frequency deviation has become lower than specified, is permitted for the first time to make a noise reduction operation and continuously performs this operation in accordance with the extent of the antenna input level and the carrier frequency deviation.

Figure 3:
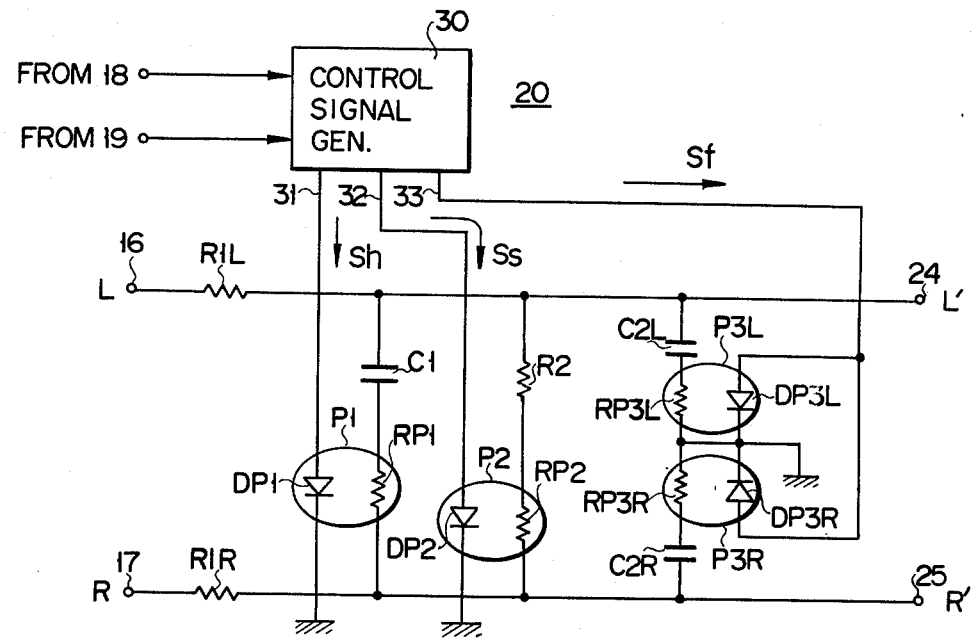
FIG. 3 is a schematic circuit diagram of the noise reduction circuit of FIG. 1.

The noise reduction circuit 20 may be constituted as shown in, for example, FIG. 3. A control signal generator 30 is provided which generates, in response to the outputs from the detectors 18, 19, first, second and third DC control signals $Sh$, $Ss$ and $Sf$ each having a magnitude which is a function of the antenna input level and the carrier frequency deviation degree. In this embodiment, the magnitude of the first, second and third control signals $Sh$, $Ss$ and $Sf$ increases with decreases in the antenna input level and frequency deviation degree.

The outputs 16, 17 of the stereo detector 15 are connected to the outputs 24, 25 of the noise reduction circuit 20 through resistors R1L, R1R, respectively. Connected between the outputs 24, 25 is a series combination of a capacitor C1 and a first light responsive variable resistance element or CdS cell RP1 constituting a first photocoupler P1 together with a first light emitting diode DP1. The diode DP1 emits, in response to the current allowed to flow therethrough upon its receipt of the first control voltage signal $Sh$ from the control signal generator 30, light having an intensity substantially corresponding to the magnitude of the signal $Sh$, thereby to control the resistance value of the variable resistance element RP1 in accordance with the magnitude of the signal $Sh$. Further connected between the outputs 24, 25 is a series combination of a resistor R2 and a second light responsive variable resistance element of CdS cell RP2 constituting a second photocoupler P2 together with a second light emitting diode DP2. The diode DP2 emits, in response to the second control signal $Ss$, light having an intensity substantially corresponding to the magnitude of the signal $Ss$, thereby to control the resistance value of the variable resistance element RP2 in accordance with the magnitude of the signal $Ss$. Further connected between the output 24 and circuit ground is a series combination of a capacitor C2L and a third light responsive variable resistance element or CdS cell RP3L constituting a third photocoupler P3L together with a third light emmitting diode DP3L. And further connected between the output 25 and the circuit ground is a series combination of a capacitor C2R and a fourth light responsive variable resistance element or CdS cell RP3R constituting a fourth photocoupler P3R together with a fourth light emitting diode DP3R. The third and fourth light emitting diodes DP3L, DP3R emit, in response to the third control signal $Sf$, light having an intensity substantially corresponding to the magnitude of the signal $Sf$, thereby to control the resistance value of the third and fourth variable resistance elements RP3L and RP3R, respectively.

Figure 4:
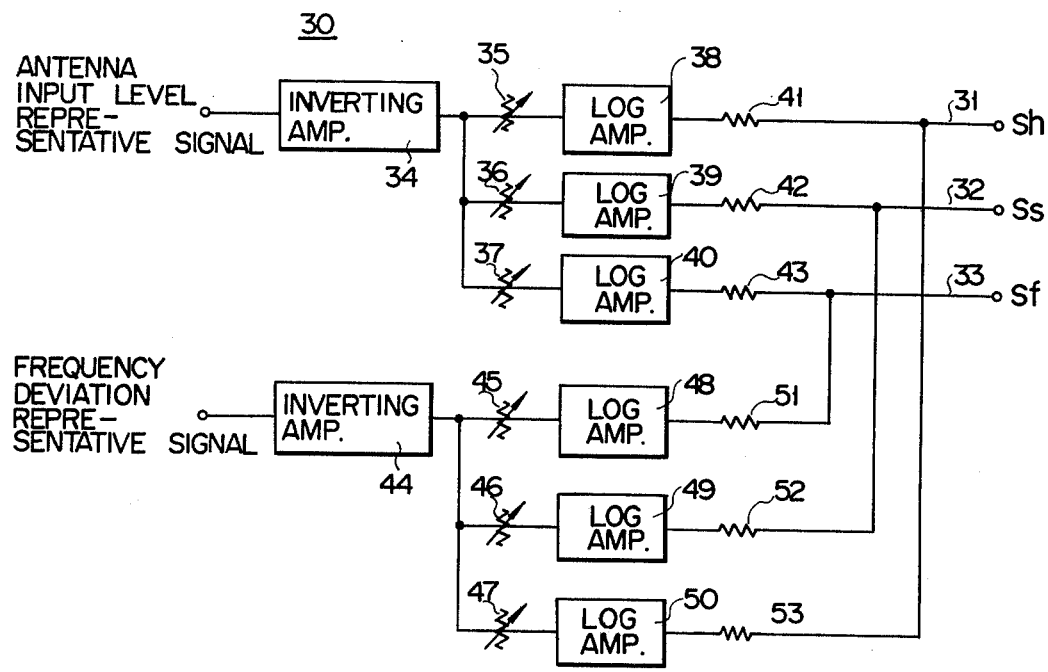
FIG. 4 is a schematic block diagram of the control signal generator of FIG. 3.

The control signal generator 30 of FIG. 3 may be constructed as shown in, for example, FIG. 4. The antenna input representative signal from the antenna input level detector 18 is applied to an inverting amplifier 34. The output voltage of the inverting amplifier 34 increases with a decrease in the antenna input level and vice versa, and is applied to log amplifiers 38, 39 and 40 through level setting means or variable resistance means 35, 36 and 37, respectively. The outputs of the log amplifiers 38, 39 and 40 are coupled to the outputs 31, 32 and 33 of the generator 30 through mixing resistors 41, 42 and 43, respectively. The frequency deviation representative signal from the frequency deviation detector 19 is applied to an inverting amplifier 44. The output voltage of the inverting amplifier 44 increases with a decrease in the carrier frequency deviation and vice versa, and is coupled to log amplifiers 48, 49 and 50 through level setting means or variable resistance means 45, 46 and 47. The outputs of the log amplifiers 48, 49 and 50 are coupled to the outputs 31, 32 and 33 of the generator 30 through mixing resistors 51, 52 and 53, respectively.

The operation of the noise reduction system of the invention will now be explained.

When the antenna input level is sufficiently high and the carrier frequency deviation degree is sufficiently large, the output voltages of the inverting amplifiers 34 and 44 of the control circuit 30 are very low, so that the first, second and third control signals S$h$, S$s$ and S$f$ respectively are substantially zero volt. As a result, the variable resistance elements RP1, RP2, RP3L and RP3R respectively have substantially maximum resistance values (of 10 MΩ or more) and the outputs L and R of the stereo detector 15 are substantially coupled to the outputs 24 and 25 of the noise reduction circuit 20, respectively, to permit the reproduction of stereo signals with good separation and good signal-to-noise ratio.

Next, where either one or both of the antenna input level and the carrier frequency deviation become lower than specified, both output voltages of the inverting amplifiers 34 and 44 are increased, so that the first, second and third control signals S$h$, S$s$ and S$f$ of the control signal generator 30 respectively have relatively high voltages in accordance with the antenna input level and/or carrier frequency deviation degree. As a result, the variable resistance elements RP1, RP2, RP3L and RP3R respectively have relatively small resistance values (in the order of several hundred ohms). For this reason, the high-blend circuit having the capacitor C1 and variable resistance element RP1 operates to permit the mixing of the high frequency components of the outputs L and R from the stereo detector 15, thereby to cancel the opposite phase high frequency noise components contained in the outputs L and R. Further, for the same reason, the full range blend circuit having the resistor R2 and variable resistance element RP2 also operates to cancel especially the opposite phase intermediate or lower frequency noise components contained in the outputs L and R from the stereo detector 15. Further, for the same reason, a first high frequency attenuator having the capacitor C2L and variable resistance element RP3L and a second high frequency attenuator having the capacitor C2R and variable resistance element RP3R operate to attenuate the high frequency noise components contained in the outputs L and R from the stereo detector 15.

Figure 5:
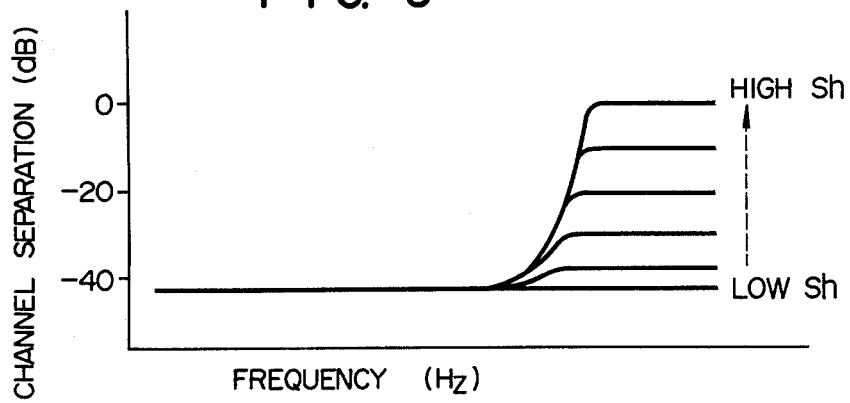
FIGS. 5, 6 and 7 are characteristic curve diagrams illustratively showing the high blend control operation, the entire frequency range separation control operation and the frequency response control operation for the noise reduction according to the invention.
Figure 6:
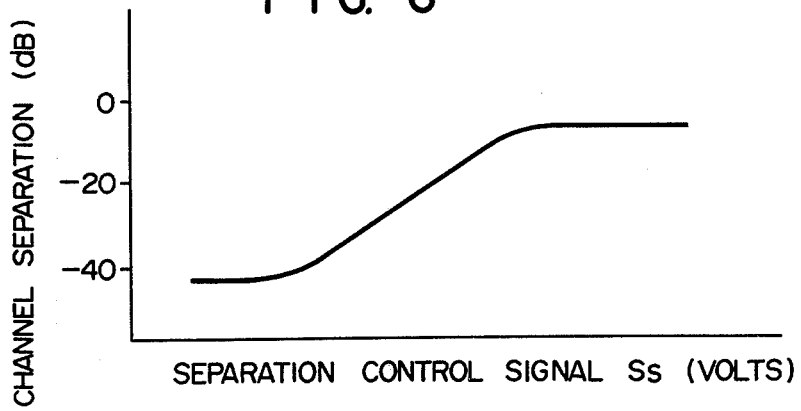
Figure 7:
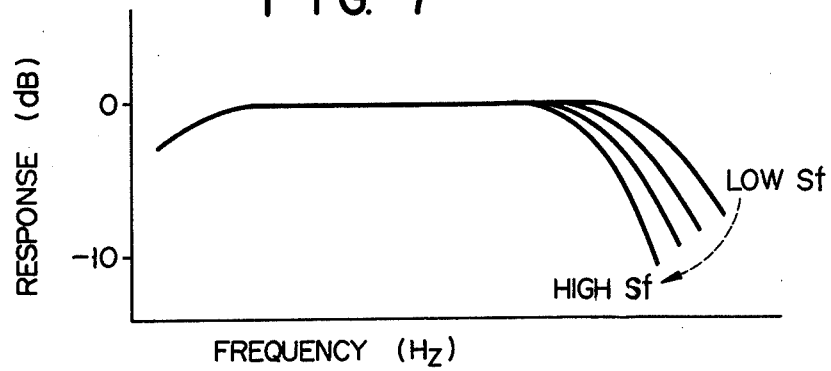

As above described, the high-blend control signal S$h$, the entire band separation control signal S$s$ and the frequency characteristic control signal S$f$ respectively have their voltages continuously raised in accordance with decreases in the antenna input level and carrier frequency deviation degree. The noise reduction circuit can therefore effectively and automatically perform three types of noise reducing operations in accordance with such a continuous high-blend operation depending on a voltage level of the high-blend control signal S$h$ as shown in FIG. 5, such a continuous entire frequency range separation control operation depending on a voltage level of the separation control signal S$s$ as shown in FIG. 6, and such a continuous frequency response control operation depending on a voltage level of the frequency response control signal S$f$ as shown in FIG. 7, respectively.

In the above-mentioned embodiment photocouplers each including a light emitting diode and a light responsive variable resistance element are used for control operations, but, according to the invention, a variable resistance element such as a field effect transistor whose resistance value between source and drain electrodes varies with the level of a control voltage applied to the gate electrode may of course be used.

What is claimed is:

1. An FM stereo receiver comprising:
   demodulation circuit means having first and second audio outputs for demodulating stereophonically related audio signals from an FM stereo transmission signal which is received by an antenna and providing the stereophonically related audio signals on said first and second audio outputs;
   first detection means for detecting input level of the FM stereo transmission signal which is received by the antenna to produce a first control signal having a voltage level corresponding to the input level;
   second detection means for detecting carrier frequency deviation of the FM stereo transmission signal to produce a second control signal having a voltage level corresponding to the carrier frequency deviation; and
   control circuit means coupled to said first and second audio outputs of said demodulation circuit means and to said first and second detection means for, when at least one of the input level and the carrier frequency deviation of the FM stereo transmission signal decreases, reducing separation between said first and second audio outputs of said demodulation circuit means and attenuating high frequency components at each of said first and second audio outputs of said demodulation circuit means,
   said control circuit means including a first blend circuit coupled between said first and second audio outputs of said demodulation circuit means for blending high frequency components at said first and second audio outputs, a second blend circuit coupled between said first and second outputs, for blending low, intermediate and high frequency components at said first and second audio outputs, and first and second attenuating circuits respectively coupled to said first and second audio outputs for attenuating high frequency components at said first and second outputs.

2. An FM stereo receiver according to claim 1, wherein said first blend circuit, said second blend circuit and said first and second attenuating circuits each include a photocoupler.

3. An FM stereo receiver comprising:
   demodulation circuit means having first and second audio outputs for demodulating stereophonically related audio signals from an FM stereo transmission signal which is received by an antenna and providing the sterophonically related audio signals on said first and second outputs;
   first detection means for detecting the input level of the FM stereo transmission signal which is received by the antenna to produce a first control signal having a voltage level corresponding to the input level;

second detection means for detecting carrier frequency deviation of the FM stereo transmission signal to produce a second control signal having a voltage level corresponding to the carrier frequency deviation; and control circuit means coupled to said first and second audio outputs of said demodulation circuit means and to said first and second detection means for, when at least one of the input level and the carrier frequency deviation of the FM stereo transmission signal decreases, reducing separation between said first and second audio outputs of said demodulation circuit means and attenuating high frequency components at each of said first and second audio outputs of said demodulation circuit means;

said control circuit means comprising means for producing third, fourth and fifth control signals each having a magnitude which is a function of the antenna input level and the carrier frequency deviation, first blend circuit means coupled between said first and second audio outputs of said demodulation circuit means to blend, in response to said third control signal, high frequency components at said first and second audio outputs to such an extent as to correspond to the magnitude of the third control signal, second blend circuit means coupled between said first and second audio outputs to blend, in response to said fourth control signal, low, intermediate and high frequency components at said first and second audio outputs to such an extent as to correspond to the magnitude of the fourth control signal, and first and second attenuating means respectively coupled to said first and second audio outputs to attenuate, in response to the fifth control signal, high frequency components of said first and second audio outputs to such an extent as to correspond to the magnitude of the third control signal.--

4. An FM stereo receiver according to claim 3, wherein said first blend circuit means includes a series combination of a capacitor and a variable resistance means which is controlled by the third control signal.

5. An FM stereo receiver according to claim 4, wherein said variable resistance means includes a photocoupler.

6. An FM stereo receiver according to claim 3, wherein said second blend circuit means comprises only resistive impedance means including a variable resistance means which is controlled by the fourth control signal.

7. An FM stereo receiver according to claim 6, wherein said variable resistance means includes a photocoupler.

8. An FM stereo receiver according to claim 3, wherein said first and second attenuating means each comprises a series combination of a capacitor and a variable resistance means which is controlled by the fifth control signal between circuit ground and the corresponding one of said first and second audio outputs.--

9. An FM stereo receiver according to claim 8, wherein said variable resistance means includes a photocoupler.

10. An FM stereo receiver according to claim 3, wherein said means for producing third, fourth and fifth control signals comprises a first inverting amplifier coupled to the output of said first detection means, a second inverting amplifier coupled to the output of said second detection means, first, second and third log amplifiers the inputs of which are coupled to the output of said first inverting amplifier, fourth, fifth and sixth log amplifiers the inputs of which are coupled to the output of said second inverting amplifier, a first mixing circuit coupled to the outputs of said first and fourth log amplifiers to provide the third control signal, a second mixing circuit coupled to the outputs of said second and fifth log amplifiers to provide the fourth control signal, and a third mixing circuit coupled to the outputs of said third and sixth log amplifiers to provide the fifth control signal.

* * * * *